United States Patent [19]
Silberberg

[11] Patent Number: 4,772,854
[45] Date of Patent: Sep. 20, 1988

[54] ALL OPTICAL REPEATER
[75] Inventor: Yaron Silberberg, Princeton, N.J.
[73] Assignee: Bell Communications Research, Inc., Livingston, N.J.
[21] Appl. No.: 946,433
[22] Filed: Dec. 24, 1986
[51] Int. Cl.[4] .......................... H01L 27/14; H01S 3/19; H01J 40/14
[52] U.S. Cl. ........................................ 330/4.3; 372/21; 350/96.13
[58] Field of Search ....................... 330/4.3; 350/96.13, 350/355; 455/601, 610, 611; 372/18, 21, 46, 43, 48; 357/30

[56] References Cited
U.S. PATENT DOCUMENTS

| | | | |
|---|---|---|---|
| 4,162,460 | 7/1979 | Gonda | 330/4.3 |
| 4,376,307 | 3/1983 | Rozzi et al. | 330/4.3 |
| 4,435,809 | 3/1984 | Tsang et al. | 372/20 |
| 4,546,244 | 10/1985 | Miller | 372/46 |
| 4,716,449 | 12/1987 | Miller | 356/56 |

OTHER PUBLICATIONS

Silberberg, Y.; "All Optical Repeater"; Opt. Lett., vol. 11, No. 6, 6/86.
Silberberg et al; "Passive Mode Locking . . . Laser", Opt. Lett., vol. 9, No. 11, 11/84.
Sharfir et al; "Nonlinear Diode Laser . . . Logic"; 1986, Eastern Conf. on Opt. and Comp.; vol. 700, pp. 77–82, 7/11/86, Abst. only provided.

Primary Examiner—Nelson Moskowitz
Attorney, Agent, or Firm—James W. Falk

[57] ABSTRACT

An all-optical device containing saturable gain, saturable loss and unsaturable loss regions which functions to transform weak, distorted optical pulses into uniform standard-shape pulses. The device performs thresholding, amplification and pulse shaping as required from an optical repeater, and may be implemented in semiconductor technology.

5 Claims, 2 Drawing Sheets

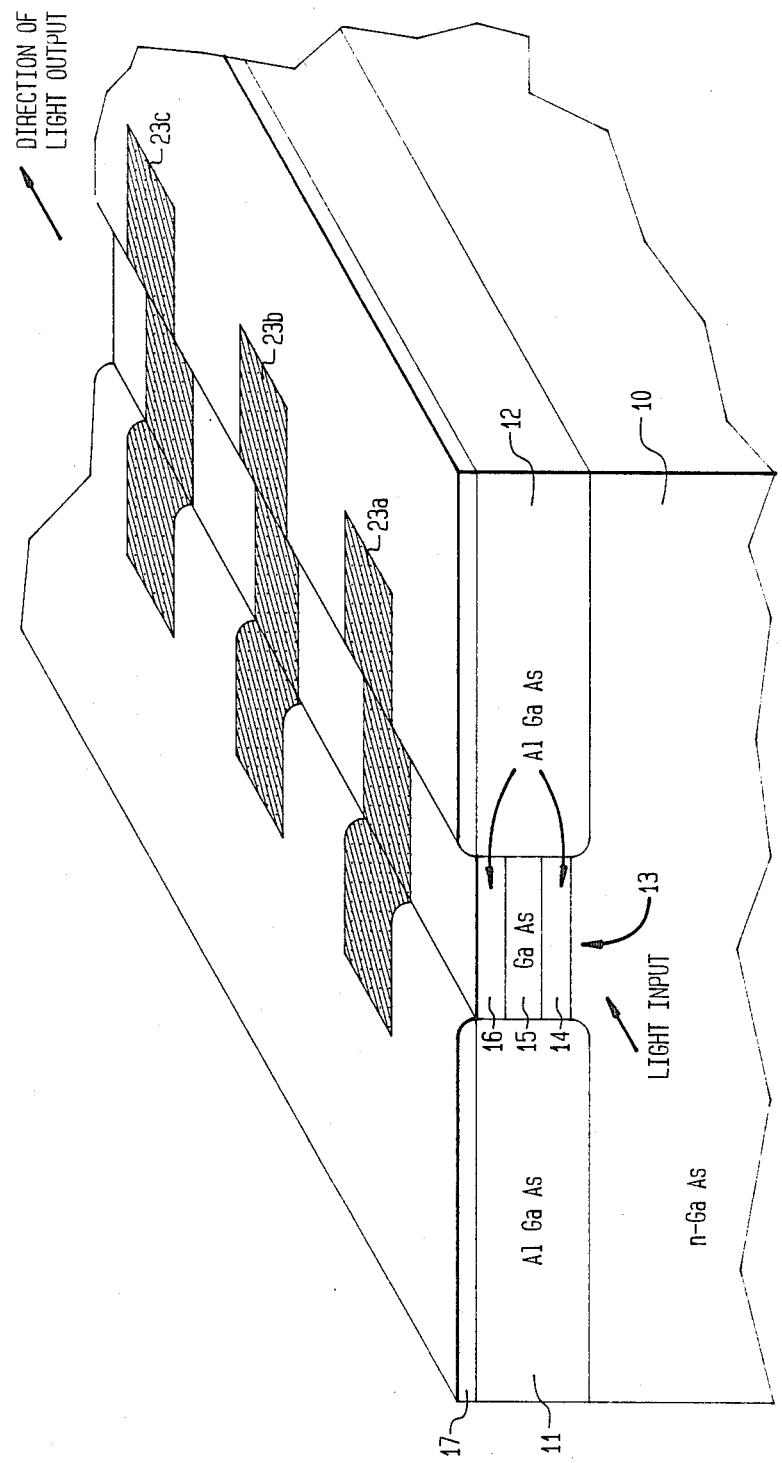

ALL OPTICAL REPEATER

BACKGROUND OF THE INVENTION

1. Field of the Invention

The invention relates to repeaters for use in optical communications systems, and particularly a repeater constructed from a semiconductor laser structure modified to act as an optical repeater.

2. Description of the Prior Art

Optical communications systems in which information is conveyed in the form of a modulated beam of light propagated through an optical fiber are well known in the prior art.

Existing repeaters in optical communication systems are constructed from an optical detector, which transforms the optical pulses into electrical pulses, an electronic system which processes the signal, and a laser transmitter which regenerates the optical signal. These devices are complex and expensive. Most important, they are limiting the capacity of the channel much below the possible capability of the optical fiber.

Prior to the present invention, there has not been a successful technique to regenerate the optical pulses without transforming them into electrical pulses.

Such an all-optical repeater can be used in long-haul optical communication systems, to compensate for loss and distortions caused by the transmission medium (optical fiber). It can be important in local area networks, where signal attenuation is caused by splitting it into many channels, or by inserting many lossy devices into the network.

SUMMARY OF THE INVENTION

Briefly, and in general terms, the invention provides an optical amplifier including a first semiconductor interface for transmitting an electromagnetic wave of optical or microwave frequency; a semiconductor body region forming a region of alternating saturable optical gain and loss having a first edge abutting an edge of said first interface so that an optical pulse entering such region is amplified and pulse shaped, and a third semiconductor interface for transmitting an electromagnetic wave of optical or microwave frequency, the third body interface having an edge abutting said second edge of said body region and spaced apart from the first interface.

BRIEF DESCRIPTION OF THE DRAWING

FIG. 2 is a perspective view of a second embodiment of the all-optical repeater according to the present invention.

DESCRIPTION OF THE PREFERRED EMBODIMENT

Figure 1:
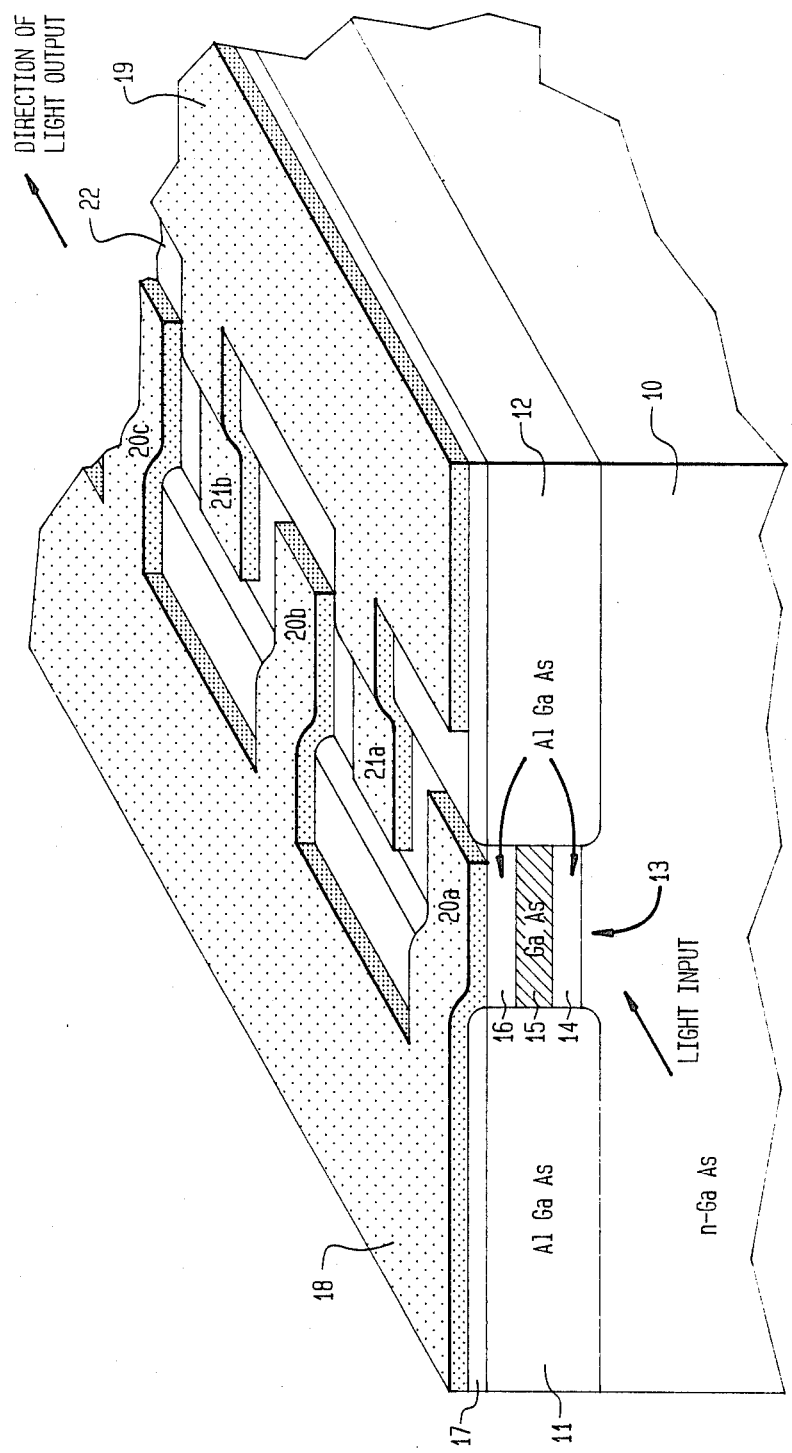
FIG. 1 is a perspective view of a first embodiment of the all-optical repeater according to the present invention.

A repeater in an optical communication link receives the optical pulses which were attenuated and distorted by the transmission medium, and transmits an amplified, reshaped version of the same pulses. Such a repeater is usually constructed from an optical detector, followed by an electronic system which performs the thresholding and timing required for the regeneration of the pulses, which are then re-emitted by a laser diode. Repeaters are necessary not only in long-haul transmission systems, but also in many local-area-networks schemes, where attenuation is caused by multiple tappings or by distribution of the same signal into many channels.

The present invention provides an all-optical repeater which can perform the thresholding, amplification and reshaping without transforming the optical pulses into electrical ones. The proposed device combines saturable optical gain and loss, as well as unsaturable loss. Such a device can be fabricated by standard semiconductor technology. The advantages of such a device are many. It is simple in structure, and thus can be relatively cheap. It can be fast since it is not limited by the speed of electronics. An all-optical repeater will not destroy the coherence of the optical signal, which can be useful for various communication schemes. Other wavelengths, (in the semiconductor case—longer wavelengths) can propagate through the repeater without interacting with it—another useful option for network design. Note, however, that an all-optical repeater does not re-time the optical pulses, and thus it lacks one important function of the electronic repeater. In addition, proper operation of the device requires the pulse duration to be much shorter than the interval between pulses.

All-optical devices performing nonlinear optical functions such as limiters, differential amplifiers and logic gates have been proposed before, usually in the context of optical bistability, "Optical Bistability 2", C. M. Bowden, H. M. Gibbs, and S. M. McCall, Eds., Plenum Press, New York, 1984. These devices are usually based on a nonlinear index of refraction change. At the present stage these devices still require extensive material research in order to prove useful. The present invention, by using optical gain and loss, avoids most of the problems associated with bistable devices. The operation principle behind this device is similar to that of passively mode-locked lasers—a balance in the saturation of the two species. The successful operation of mode-locked laser in general, and in particular the recent achievements in mode-locking of semiconductor diode lasers, P. W. Smith, Y. Silberberg and D. A. B. Miller, J. Opt. Soc. Am. B., 2, 1228 (1985), may indicate that an all-optical repeater is practical.

The analysis presented here follows that of a mode-locked laser with a slow saturable absorber, H. A. Hause, IEEE J. Quantum Electron. QE-11, 736 (1975). Assume a medium of length L which contains a homogeneous mixture of gain and loss. The analysis will be still valid if the gain and loss are alternated in separate sections, provided that the optical thickness of each section is small. We will use the rate equation approximation for the gain and assume loss, and that the incoming pulse length is much shorter than the response time of both media. We further assume a plane-wave geometry, which will also be a good approximation for a waveguide geometry. Let $N_g$ and $N_a$ be the densities of inverted gain population and of ground state population of the loss medium, respectively. The rates of change of the two species are $$dN_g/dt = -N_g S_g I / h\nu \qquad (1)$$

$$dN_a/dt = -N_a S_a I / h\nu \qquad (2)$$

where $I(z,t)$ is the light intensity, and $S_g$ and $S_a$ are the emission and absorption cross-sections, respectively. Equations (1) and (2) are trivially solved by $$N_i = N_i^0 \exp(-S_i \int I\, dt / h\nu), \quad i = g, a \qquad (3)$$

where $N_i^0$ are the initial values of $N_i, i=g,a$.

Consider a section of thickness dz. Let E be the pulse energy entering this section. The pulse emerging from this section gains $(N_g^0-N_g^f)dz$ photons from stimulated emission, and losses $(N_a^0-N_a^f)dz$ photons by absorption, where $N_i^f$, $1=a,g$ is the value of Ni after the passage of the pulse. The incremental gain to the pulse energy is, then, $$dE/dz = N_g^0[1-exp(-S_gE)] - N_a^0[1-exp(-S_aE)] - \alpha_0 E \quad (4)$$

where $\alpha 0$ is the background unsaturable loss. A low energy pulse will experience a gain or loss given by:

$$(1/E)dE/dz = N_g^0 S - N_a^0 S - \alpha 0 \quad (5)$$

while for very high energy pulses the loss approaches the unsaturable absorption $\alpha 0$.

In order to be useful as a repeater, we should require loss for low energy pulses below a certain threshold and gain for pulses above this threshold. However, in order to ensure that all the amplified pulses reach the same level, we should require also that the gain will stop once the pulse energy reaches a certain final value. The first requirement can be met if the low signal amplification (5) is made negative (i.e., loss), and the absorber is saturating faster than the gain, so that stronger pulses see gain. This can be realized only if $S_a > S_g$. The second condition requires a finite unsaturable loss, i.e., $\alpha_0 > 0$. There are two energy values which are neither amplified nor attenuated as they propagate through such a medium. These energies are the steady-state solutions, and they are given by the intersections with the energy axis. Note, however, that the lower of these values is unstable: any perturbation in the energy value will cause it to move further away from the steady-state value. This is the threshold energy, $E_{th}$. Any input pulse with energy below it will be attenuated as it propagates along the medium, while pulses with $E > E_{th}$ will be amplified. If the medium is long, the propagating pulse energy will asymptotically approach the other steady-state value, $E_f$.

In order to be able to predict the shape of the final pulse, further assumptions are necessary. In particular, a bandwidth limiting process must be invoked, in order to prevent the propagating pulse from becoming infinitely narrow. Note that the effect of a bandwidth limiting element is to increase the loss for some frequency components of the pulse, and hence it can be expected that the energy values predicted in the previous section will be altered. Using the slowly varying amplitude approximation, the wave equation for the field amplitude A can be written as [4]:

$$\Delta dA/ds + dA/dz = Dd^2A/ds^2 + (N_gS_g - N_aS_a - \alpha_0)A/2 \quad (6)$$

where $s = t - z/v$ is the local time, $\Delta = 1/v - n/c$ is the difference in inverse velocities with v being the pulse group velocity, and c/n is the velocity of light in the medium. D is the bandwidth limiting term. If bandwidth limitation is coming from the shape of a Lorenzian gain, then $D = G/uu_c$, where G is the peak gain and $uu_c$ is the FWHM of the gain function.

In order to find the steady-state pulse which propagates along z without attenuation or distortion, we try the solution $A = A_0 sech(s/t)$. Substituting in Eq. (3) leads to:

$$\begin{aligned} N_i &= N_i^0 exp\{-S_iA_0^2\tau[tanh(s/\tau)+1]/2\} \\ &= N_i^0 exp(-S_iA_0^2\tau/h(/)\{1 - S_iA_0^2 tanh(s/\tau)/2 + \tfrac{1}{2}[S_iA_0^2\tau tanh(s/\tau)/2]^2 + \ldots\} \end{aligned} \quad (7)$$

Keeping the expansion in Eq. (7) to second order, and substituting in Eq. (6) lead to three algebraic equations for terms with different functional form:

$$d/t^2 = \tfrac{1}{2}\{S_gN_g^0 exp - S_gE//2^2) - S_aN_a exp(-S_aE/2)\} \quad (8)$$

$$-D/t^2 = \tfrac{1}{2}\{S_gN_g^0 exp(-S_gE/2)(S_gE/2)^2 - S_aN_a^0 exp(-S_aE/2)(S_aE/2)^2\} \quad (9)$$

$$\Delta/t = \tfrac{1}{2}\{S_gN_g^0 exp(-S_gE/2) S_gE/2 - S_aN_a^0 exp(-S_aE/2)S_aE/2, \quad (10)$$

where we have used the fact that $E = 2A_0^2 t$ is the pulse energy. Equations (8) and (9) can be used to solve for E and t, and Eq. (10) is then used to find the pulse delay $\Delta$. Note that an equation for the pulse energy can be easily derived from (8) and (9), which will be independent of the bandwidth term D. This resulting energy is lower, however, then that predicted by Eq. (3). The final pulsewidth is a function of the spectral bandwidth. The delay term reflects the fact that the pulse can be pushed forward or backward in time by the combined effect of saturable absorption and gain.

We have performed simulations of pulse propagation in a medium described by Eqs. (1), (2) and (7). Note the attenuation of a low energy pulse and the amplification of a higher energy pulse. The final energy value obtained is $E_f = 3.65$, $\sigma_g^1$ as predicted by Eq. (8) and (9).

A question of practical importance is what is the total length required for sufficient pulse shaping. There is no single answer to this question. The closer is the input energy to $E_{th}$, the slower the pulse evolution will be. This is equivalent to the ambiguity of determining the value of pulses close to the threshold value in any kind of digital device. Proper design of the system should minimize the occurrence of such pulses. Note, however, that even for higher energy pulses the actual gain is the net effect of the gain and loss, which may be of a small magnitude, and therefore may require a long propagation distance. It can be estimated that the average net gain for that set of parameters is less than 5% of the value of the gain alone. It can be concluded then that long propagation distances, equivalent to many optical densities of small signal gain, are required to obtain pulse standardization.

One system which can supply enough gain is a semiconductor laser medium. Obviously, this is also the most practically important system for communication applications. The device can be fabricated from a diode laser, which is modified by the introduction of saturable loss along the gain. This loss can be generated by proton bombardment. In order to prevent the proton bombardment from affecting the gain mechanism, it would be advantageous to separate the gain and loss in different regions in space. This can be done by bombarding short stripes, with width of few tens of microns, across the gain axis. If those regions are kept short enough so that the gain and loss in each section is small, the device will behave as if the gain and loss are distributed. Moreover, by varying the relative density and width of these sections one can have an additional degree of freedom for the design of a practical device. It may be advantageous, for example to insert a section of low loss in the input side of the device which will serve as a linear amplifier to the incoming pulses. The semiconductor repeater can be much longer than a common laser diode. This will help in obtaining a high small-signal gain needed for proper operation. Note that a long device will not be plagued with high amplified spontaneous emission noise because of the net small-signal loss, which will prevent the buildup of this noise.

The temporal characteristics of the all-optical repeater are determined by the lifetime of the two dynamic species of the loss and the gain. One disadvantage of this device is that the pulse rate should be kept low enough so that the gain and loss can recover to their unsaturated values between the pulses. On the other hand, each pulse must be much shorter than these lifetimes. The result is that the bit rate should be much lower than the maximal rate determined by the pulse width. It should be noted, however, that the pulse rate can be still higher than that achievable with electronic repeaters. In the semiconductor device described before it can be expected that the recovery times of the loss and gain can be in the 100 psec range, which means that a few Gbit rates are possible. The width of the standard pulse emitted by the repeater will probably be in the 1-10 psec range. The width is expected to be limited by group velocity dispersion in the medium and not by the bandwidth of the system. However, the effect of dispersion can be corrected for by compression of the outcoming pulses, at the expense of a more complicated system.

Turning first to FIG. 1, there is shown a perspective view of a first embodiment of the present invention implemented as a modified buried heterostructure semiconductor laser. Since the design and fabrication of semiconductor laser devices are known to those skilled in the art, a detailed description of the method of fabrication of the proposed structure is only briefly described. Turning more particularly to the Figure, there is shown a substrate 10 composed of n-type gallium arsenide. Disposed of the substrate 10 is a sequence of semiconductor layers 14, 15 and 16. Layer 14 consists of a AlGaAs semiconductor layer deposited on the semiconductor substrate 10. Layer 15 is the active laser layer, which consists of a gallium arsenide layer epitaxially deposited on the AlGaAs layer and defines an optical transmissive body 14. Layer 16 consists of a AlGaAs layer substantially similar in composition to that of layer 14. Layer 16 s epitaxially deposited on layer 15. Most of the area covered by layers 14, 15 and 16 is removed by etching leaving behind a narrow stripe 13. Layers 11 and 12, made of AlGaAs are regrown in the etched regions. The active layer 15 is now surrounded by regions of lower refractive index 14, 16, 11 and 12 and forms an optical waveguide. The method of interfacing the semiconductor waveguide with a propagating electromagnetic wave of optical frequency is known to those skilled in the art of semiconductor lasers and need not be described in detail here. Suffice it to say that an interface region could be used which is optically transparent with a suitable index of refraction and suitable geometric configuration so as to provide the maximum transmission of the electromagnetic wave into the semiconductor body with a minimum of reflective and transmissive losses so as to couple the wave traveling in the guiding structure such as an optical fiber to the repeater structure according to the present invention. A layer 17 of a suitable oxide or other dielectric material is uniformly deposited over regions 11, and 12. The oxide or dielectric layer 17 has a thickness of approximately 0.2 $\mu$m. Electrodes 18, and 19 are then deposited over the oxide layer. Layer 18 and 19 are electrically isolated from one another by means of a serpentine gap 22 which separates the layers in the region of the gap region 13. In the preferred embodiment according to the present invention, electrode 18 includes fingers 20a, 20b, 20c, . . ., while layer 19 includes fingers 21a, 21b, . . . which are interdigitated with the fingers of electrode 18. The fingers 20a, 21a, 20b, 21b, 20c, . . . make physical and electrical contact with the upper surface of the AlGaAs layer 16 as shown in FIG. 1. The device of FIG. 1 operates in that one electrode supplies the current to generate gain in the gallium arsenide layer 15 underneath it, while the other electrode is biased so that the regions in the layer 15 under the fingers associated with such electrode are lossy.

The application of suitable bias currents can tune the device to operate to the required working conditions. The bias voltages are adjusted so that the loss is slightly higher than the gain. Weak input pulses are therefore attenuated. Stronger input pulses saturate the loss and are amplified.

The width of each finger is preferably larger than the lateral diffusion length of charge carriers in the structure, which is typically a few microns.

Turning next to FIG. 2, there is an alternative embodiment of the present invention in which the interdigitated fingers have been replaced by regions of ion bombardment. The semiconductor substrate 10, regions 11 and 12 layers 14, 15 and 16 and the oxide layer 17 are the same as in FIG. 1. However, ion bombardment stripes 23a, 23b, 23c extend laterally across the gap 13 to create the desired electrical effect. The ion implementation is known in the art and other regions may be protected by mask during bombardment. The mask may also be used as an upper electrode or may be removed and replaced by a uniform electrode or metal layer (not shown) which extends over the entire oxide layer 17. The width of the bombarded stripe 23a, 23b, 23c should be larger than a few microns. The ion used in the bombardment may be protons and should penetrate to the active gallium arsenide layer 15.

In conclusion, a model for an all-optical repeater, capable of thresholding, amplifying and shaping incoming optical pulses has been presented. Such a repeater could be made using common semiconductor technology. An all-optical repeater will be useful whenever regeneration of optical pulses is required. While the invention has been illustrated and described as embodied in an all optical repeater, it is not intended to be limited to the details shown, since various modifications and structural changes may be made without departing in any way from the spirit of the present invention.

Without further analysis, the foregoing will so fully reveal the gist of the present invention that others can readily adapt it for various applications without omitting features that from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. An optical amplifier comprising a substrate composed of a semiconductor material;
a semiconductor layered region disposed on said substrate including a first semiconductor layer disposed on said substrate; an active second semiconductor layer forming an elongated optical waveguide; and a third semiconductor layer, said active second semiconductor layer being sandwiched between and contiguous with said first and second semiconductor layers; said first and third conductor layers being of lower refractive index than said second layer;
first and second semiconductor regions disposed on said substrate and laterally bounding said layered region, said first and said second semiconductor regions having a lower refractive index than said active layer;
first and second interdigitated electrodes disposed on said third semiconductor layer forming a plurality of fingers extending along the direction of light propagation in said elongated optical waveguide;
means for biasing said first electrode so that a first level of electrical current is applied to a first portion of said semiconductor layered region disposed beneath said first electrode to create a region of optical gain so that an optical pulse propagating in said elongated optical waveguide is amplified in said first portion of said semiconductor layered region; and
means for biasing said second electrode so that a second level of electrical current different from said first level is applied to a second portion of said semiconductor layered region disposed beneath said second electrode to create a region of saturable optical loss in said second portion so that said optical pulse propagating in said elongated optical waveguide saturates the optical loss in said second portion and is amplified as it traverses said first and said second portions of alternating optical gain and loss.

2. An amplifier as defined in claim 1, wherein said first semiconductor layer is composed of AlGaAs, said second semiconductor layer is composed of GaAs, and third semiconductor layer is composed of AlGaAs.

3. An amplifier as defined in claim 1, wherein said first and second semiconductor regions are composed of AlGaAs.

4. An amplifier as defined in claim 1, wherein said substrate is composed of n-type gallium arsenide.

5. An amplifier as defined in claim 1, wherein the width of said first and said second electrodes is greater than a micron.

* * * * *

UNITED STATES PATENT AND TRADEMARK OFFICE
CERTIFICATE OF CORRECTION

PATENT NO. : 4,772,854

DATED : September 20, 1988

INVENTOR(S) : Yaron Silberberg

It is certified that error appears in the above-identified patent and that said Letters Patent is hereby corrected as shown below:

Column 2, line 52 "assume loss, and" should read -- and assume lost,--

Column 4, line 14 "d/t$^2$=1/2$\{S_gN_g^0\exp-S_gE//2^2)-S_aN_a\exp(-S_aE/2)\}$"

Should read -- D/t$^2$=1/2$\{S_gN_g^0\exp(-S_gE/2^2)-S_aN_a^0\exp(-S_aE/2)\}$ --

Column 5, line 43 "Disposed of" should read -- Disposed on --

Column 5, line 51 "Layer 16s" should read -- Layer 16 is --

Signed and Sealed this

Twenty-fourth Day of April, 1990

*Attest:*

HARRY F. MANBECK, JR.

*Attesting Officer*     *Commissioner of Patents and Trademarks*